(12) United States Patent
Chavez et al.

(10) Patent No.: US 8,198,612 B2
(45) Date of Patent: Jun. 12, 2012

(54) SYSTEMS AND METHODS FOR HEATING AN EUV COLLECTOR MIRROR

(75) Inventors: Juan Armando Chavez, San Diego, CA (US); Norbert R. Bowering, Bielefeld (DE)

(73) Assignee: Cymer, Inc., San Diego, CA (US)

( * ) Notice: Subject to any disclaimer, the term of this patent is extended or adjusted under 35 U.S.C. 154(b) by 469 days.

(21) Appl. No.: 12/221,313

(22) Filed: Jul. 31, 2008

(65) Prior Publication Data
US 2010/0025600 A1  Feb. 4, 2010

(51) Int. Cl.
*H01J 35/20* (2006.01)
(52) U.S. Cl. .................. 250/504 R; 250/493.1
(58) Field of Classification Search .............. 250/504 R; 359/359, 845
See application file for complete search history.

(56) References Cited

U.S. PATENT DOCUMENTS

| | | | |
|---|---|---|---|
| 5,091,244 A | 2/1992 | Biornard | 428/216 |
| 7,388,220 B2 * | 6/2008 | Fomenkov et al. | 250/504 R |
| 7,641,349 B1 * | 1/2010 | Chrobak et al. | 359/845 |
| 2007/0125970 A1 * | 6/2007 | Fomenkov et al. | 250/504 R |
| 2008/0043321 A1 * | 2/2008 | Bowering et al. | 359/359 |
| 2009/0014668 A1 * | 1/2009 | Vaschenko | 250/504 R |

OTHER PUBLICATIONS

Lazar, G. et al., "Infrared Absorption Properties of Amorphous Carbon Films," *J. of Optoelectronics and Advanced Materials*, vol. 7, No. 2, Apr. 2005, pp. 647-652.
U.S. Appl. No. 12/004,871, filed Dec. 20, 2007, Bowering et al.

* cited by examiner

*Primary Examiner* — Nikita Wells
*Assistant Examiner* — Johnnie L Smith
(74) *Attorney, Agent, or Firm* — Cymer, Inc.

(57) ABSTRACT

As disclosed herein, a device may comprise a substrate made of a material comprising silicon, the substrate having a first side and an opposed second side; an EUV reflective multilayer coating overlaying at least a portion of the first side; an infrared absorbing coating overlaying at least a portion of the second side; and a system generating infrared radiation to heat the absorbing coating and the substrate.

20 Claims, 3 Drawing Sheets

SYSTEMS AND METHODS FOR HEATING AN EUV COLLECTOR MIRROR

CROSS-REFERENCE TO RELATED APPLICATIONS

The present application is related to co-pending U.S. patent application Ser. No. 12/004,871 filed on Dec. 20, 2007, entitled EUV LIGHT SOURCE COMPONENTS AND METHODS FOR PRODUCING, USING AND REFURBISHING SAME; and U.S. Pat. No. 7,388,220 filed on Jul. 27, 2004, entitled EUV LIGHT SOURCE; the entire contents of each of which are hereby incorporated by reference herein.

FIELD

The present application relates to extreme ultraviolet ("EUV") light sources providing EUV light from a plasma created from a material and collected and directed to a focus for utilization outside of the EUV light source chamber, e.g., for semiconductor integrated circuit manufacturing photolithography e.g., at wavelengths of around 50 nm and below.

BACKGROUND

EUV light, e.g., electromagnetic radiation in the EUV spectrum (i.e. having wavelengths of about 5-100 nm), may be useful in photolithography processes to produce extremely small features, e.g., sub-32 nm features, in semiconductor substrates, such as silicon wafers.

Methods to produce EUV light include, but are not necessarily limited to, converting a material into a plasma state that has one or more elements, e.g., xenon, lithium or tin, indium, antimony, tellurium, aluminum, etc., with one or more emission line(s) in the EUV spectrum. In one such method, often termed laser produced plasma ("LPP"), a plasma can be produced by irradiating a target material, such as a droplet, stream, or cluster of material having the line-emitting element, with a laser beam. Another method involves disposing the line-emitting element between two electrodes. In this method, often termed discharge produced plasma ("DPP"), a plasma can be produced by creating an electrical discharge between the electrodes.

For these processes, the plasma is typically produced in a sealed vessel, e.g., vacuum chamber, and monitored using various types of metrology equipment. A typical EUV light source may also include one or more EUV mirrors. In general, these EUV mirrors may be either grazing incidence-type mirrors, or near-normal incidence type mirrors. e.g., a substrate covered with a multi-layer coating such as Mo/Si. One or more of these mirrors may then be disposed in the sealed vessel, distanced from the irradiation site, and oriented to direct EUV light emitted from the plasma to an EUV light source output location. By way of example, for an LPP setup, the mirror may be in the form of e.g., a prolate spheroid having a circular cross-section normal to a line passing through its foci, and having an elliptical cross-section in planes, including the line passing through the foci. In some cases, an aperture may be provided to allow the laser light to pass through and reach the irradiation site. With this arrangement, the irradiation site may be positioned at or near a first focus of the prolate spheroid, and the light source output may be positioned at, near or downstream of the second focus.

Several factors may be considered when selecting a substrate material for an EUV mirror. These can include temperature stability, vacuum compatibility, chemical stability, manufacturability, including the ability of the material to be easily shaped and polished, thermal mass, and material availability and cost. With these factors in mind, substrate candidates can include silicon (single crystal and polycrystalline) and silicon carbide.

In addition to generating EUV radiation, these plasma processes described above may also generate undesirable by-products, so-called debris, in the plasma chamber which can include high energy ions and/or atoms including target material vapor and/or clumps/micro-droplets of the target material. These plasma formation by-products can potentially heat, damage or reduce the operational efficiency of the various plasma chamber optical elements including, but not limited to, the mirrors described above, the surfaces of metrology detectors, windows used to image the plasma formation process, and the input window allowing the laser to enter the plasma chamber. The debris may be damaging to the optical elements in a number of ways, including coating them with materials which reduce light transmission, penetrating into them and, e.g., damaging structural integrity and/or optical properties, e.g., the ability of a mirror to reflect light at such short wavelengths, corroding, roughening or eroding them and/or diffusing into them.

Accessing contaminated or damaged optical elements in the plasma chamber for the purpose of cleaning or replacing the elements can be expensive, labor intensive and time-consuming. In particular, these systems typically require a rather complicated and time-consuming purging and vacuum pump-down of the plasma chamber prior to a re-start after the plasma chamber has been opened. This lengthy process can adversely affect production schedules and decrease the overall efficiency of light sources for which it is typically desirable to operate with little or no downtime.

For some target materials, e.g., tin, it may be desirable to introduce an etchant, e.g., $Cl_2$, $Br_2$, HBr, HI, HCl, $H_2$, $CF_3$, H radicals, some other halogen-containing compound, or combinations thereof, into the plasma chamber to etch material, e.g. debris that has deposited on the optical elements. This etchant may be present during light source operation, during periods of non-operation, or both. To increase the efficacy of these etchants, it may be desirable to heat and/or maintain the affected surfaces within a preselected temperature range to initiate reaction and/or increase the chemical reaction rate of the etchant and/or to maintain the etching rate at a certain level. For other target materials, e.g., lithium, it may be desirable to heat the affected surfaces where lithium debris has deposited to a temperature sufficient vaporize at least a portion of the deposited material, e.g., a temperature in the range of about 400 to 550 degrees C. to vaporize Li from the surface, with or without the use of an etchant.

Depending on the light source configuration, the above-described heating may be applied during EUV light source operation (i.e., while a plasma is being generated) and/or during startup, e.g., until the optic receives sufficient heat from another source such as the plasma and/or during periods of EUV light source downtime.

With the above in mind, applicants disclose systems and methods for heating an EUV collector mirror.

SUMMARY

In a first aspect, a device may comprise a substrate made of a material comprising silicon, the substrate having a first side and an opposed second side; an EUV reflective multi-layer coating overlaying at least a portion of the first side; an infrared absorbing coating overlaying at least a portion of the second side; and a system generating infrared radiation to heat the absorbing coating and the substrate.

In one embodiment, the system may comprise an infrared radiator and a source passing current through the radiator. The infrared radiator may be spaced from the infrared absorbing coating.

In one implementation, the device may further comprise a chamber and the infrared radiator and the substrate may be disposed in the chamber. For this implementation, the device may further comprise a vacuum system evacuating the chamber and/or a source for introducing an etchant into the chamber. For example, the etchant is selected from the group of etchants consisting of $Cl_2$, $Br_2$, HBr, HI, HCl, $H_2$, $CF_3$, H radicals, some other halogen-containing compound, and combinations thereof.

In one design, the radiator may be formed as a ribbon, and in another design. the radiator may be formed as a wire.

In one arrangement, an infrared reflector may be positioned to interpose the infrared radiator between the reflector and the infrared coating. For example, the reflector may have a surface shaped to substantially conform with the shape of the substrate second side.

In a particular construction of this aspect, the infrared radiator may comprise a plurality of resistive elements and a plurality of sources, each source passing current through at least one resistive element.

Examples of coating materials include, but are not necessarily limited to, Titanium Oxide, an Aluminum Titanium multilayer material, and nitrides such as Silicon Nitride, Boron Nitride, Carbon Nitride, Niobium Nitride, Zirconium Nitride, Titanium Nitride, Aluminum Nitride and Silicon Oxy-nitride, and combinations thereof.

In a particular setup, the coating may overlay the second side of the substrate non-uniformly, and may configured to heat a first zone of the substrate to a first temperature, $T_1$, and heat a second zone of the substrate to a second temperature, $T_2$, with $T_1 \neq T_2$.

In another aspect, a device may comprise a substrate made of an infrared transparent material; an EUV reflective multilayer coating overlaying at least a portion of the substrate; an infrared absorbing coating overlaying at least a portion of the substrate; and a conductor radiating infrared radiation, the conductor spaced from the infrared absorbing coating to heat the absorbing coating and the substrate.

For example, the substrate may be made of silicon (single crystal or polycrystal) or silicon carbide and the coating materials may include, but are not necessarily limited to, Titanium Oxide, an Aluminum Titanium multilayer material, and nitrides such as Silicon Nitride, Boron Nitride, Carbon Nitride, Niobium Nitride, Zirconium Nitride, Titanium Nitride, Aluminum Nitride and Silicon Oxy-nitride, and combinations thereof.

For this aspect, the device may further comprise a chamber, the substrate disposed in the chamber, and a source for introducing an etchant into the chamber.

In another aspect, an EUV light source may comprise a chamber; a system generating an EUV light emitting plasma in the chamber; an optic positioned in the chamber, the optic having a surface exposed to EUV light; a system generating radiation; and a material coupled to the optic to absorb at least a portion of the radiation and generate heat from the absorption to heat the optic to a temperature exceeding 100 degrees centigrade.

DETAILED DESCRIPTION

Figure 1:
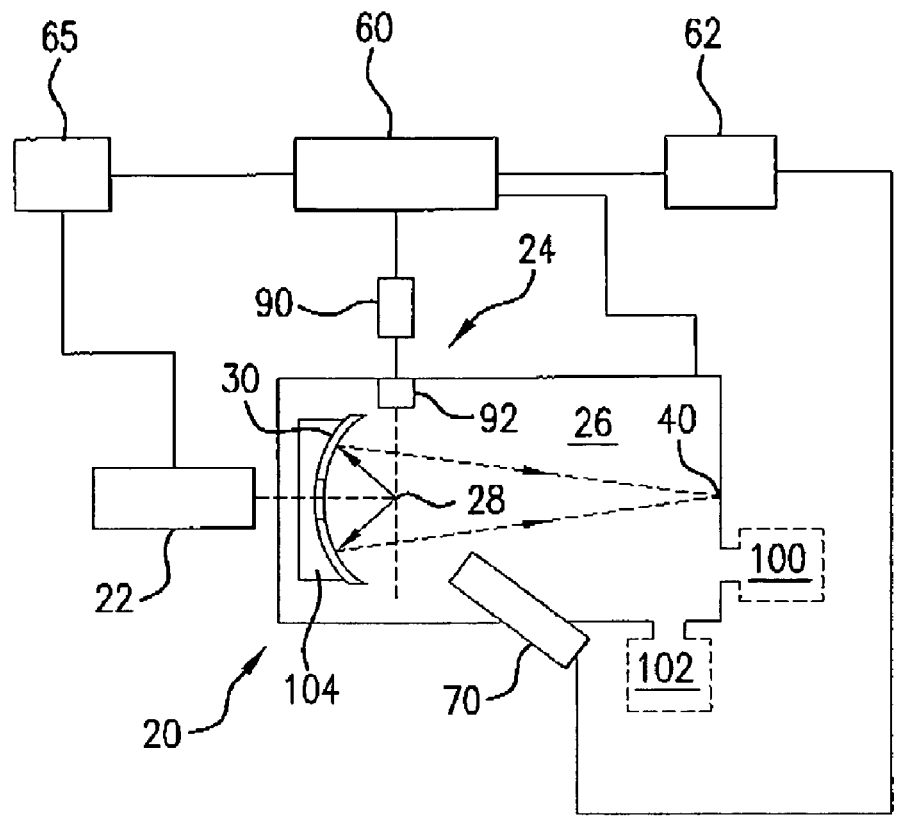
FIG. 1 shows a simplified schematic view of a laser-produced plasma EUV light source according to an aspect of the present disclosure.

With initial reference to FIG. 1, there is shown a schematic view of an EUV light source, e.g., a laser-produced-plasma, EUV light source 20 according to one aspect of an embodiment. As shown in FIG. 1, and described in further detail below, the light source 20 may include a system 22 for generating a train of light pulses and delivering the light pulses into a chamber 26. For the light source 20, each light pulse may travel along a beam path from the system 22, and into the chamber 26 to illuminate a respective target droplet at an irradiation region 28.

Suitable lasers for use as the system device 22 shown in FIG. 1 may include a pulsed laser device, e.g., a pulsed gas discharge $CO_2$ laser device producing radiation at 9.3 µm or 10.6 µm, e.g., with DC or RF excitation, operating at relatively high power, e.g., 10 kW or higher, and high pulse repetition rate, e.g., 50 kHz or more. In one particular implementation, the laser may be an axial-flow, RF-pumped $CO_2$ having a MOPA configuration with multiple stages of amplification and having a seed pulse that is initiated by a Q-switched Master Oscillator (MO) with low energy and high repetition rate, e.g., capable of 100 kHz operation. From the MO, the laser pulse may then be amplified, shaped, steered and/or focused before entering the LPP chamber. Continuously pumped $CO_2$ amplifiers may be used for the system 22. For example, a suitable $CO_2$ laser device having an oscillator and three amplifiers (O-PA1-PA2-PA3 configuration) is disclosed in U.S. patent application Ser. No. 11/174,299 filed on Jun. 29, 2005, and entitled, LPP EUV LIGHT SOURCE DRIVE LASER SYSTEM, the entire contents of which are hereby incorporated by reference herein. Alternatively, the laser may be configured as a so-called "self-targeting" laser system in which the droplet serves as one mirror of the optical cavity. In some "self-targeting" arrangements, a master oscillator may not be required. Self-targeting laser systems are disclosed and claimed in U.S. patent application Ser. No. 11/580,414 filed on Oct. 13, 2006 entitled, DRIVE LASER DELIVERY SYSTEMS FOR EUV LIGHT SOURCE, the entire contents of which are incorporated by reference herein.

Depending on the application, other types of lasers may also be suitable, e.g., an excimer or molecular fluorine laser operating at high power and high pulse repetition rate. Examples include, a solid state laser, e.g., having a rod, fiber or disk-shaped active media, a MOPA configured excimer laser system, e.g., as shown in U.S. Pat. Nos. 6,625,191, 6,549,551, and 6,567,450, an excimer laser having one or more chambers, e.g., an oscillator chamber and one or more amplifying chambers (with the amplifying chambers in parallel or in series), a master oscillator/power oscillator (MOPO) arrangement, a power oscillator/power amplifier (POPA) arrangement, or a solid state laser that seeds one or more excimer or molecular fluorine amplifier or oscillator chambers, may be suitable. Other designs are possible.

As further shown in FIG. 1, the EUV light source 20 may also include a target material delivery system 24, e.g., delivering droplets of a target material into the interior of a chamber 26 to the irradiation region 28, where the droplets will interact with one or more light pulses, e.g., zero, one, or more pre-pulses and thereafter one or more main pulses, to ultimately produce a plasma and generate an EUV emission. The target material may include, but is not necessarily limited to, a material that includes tin, lithium, xenon or combinations thereof. The EUV emitting element, e.g., tin, lithium, xenon, etc., may be in the form of liquid droplets and/or solid particles contained within liquid droplets. For example, the element tin may be used as pure tin, as a tin compound, e.g., $SnBr_4$, $SnBr_2$, $SnH_4$, as a tin alloy, e.g., tin-gallium alloys, tin-indium alloys, tin-indium-gallium alloys, or a combination thereof. Depending on the material used, the target material may be presented to the irradiation region at various temperatures including room temperature or near room temperature (e.g., tin alloys, $SnBr_4$) at an elevated temperature, (e.g., pure tin) or at temperatures below room temperature, (e.g., $SnH_4$), and in some cases, can be relatively volatile, e.g., $SnBr_4$. More details concerning the use of these materials in an LPP EUV source is provided in U.S. patent application Ser. No. 11/406,216, filed on Apr. 17, 2006 entitled ALTERNATIVE FUELS FOR EUV LIGHT SOURCE, the contents of which are hereby incorporated by reference herein.

Continuing with FIG. 1, the EUV light source 20 may also include an optic 30, e.g., a near-normal incidence collector mirror having a reflective surface in the form of a prolate spheroid (i.e., an ellipse rotated about its major axis) having, e.g., a graded multi-layer coating with alternating layers of Molybdenum and Silicon, and in some cases one or more high temperature diffusion barrier layers, smoothing layers, capping layers and/or etch stop layers.

FIG. 1 shows that the optic 30 may be formed with an aperture to allow the light pulses generated by the system 22 to pass through and reach the irradiation region. As shown, the optic 30 may have an EUV reflective surface having the shape of a truncated prolate spheroid which has a first focus within or near the irradiation region 28 and a second focus at a so-called intermediate region 40 where the EUV light may be output from the EUV light source 20 and input to a device utilizing EUV light, e.g., an integrated circuit lithography tool (not shown). It is to be appreciated that other optics may be used in place of the prolate spheroid mirror for collecting and directing light to an intermediate location for subsequent delivery to a device utilizing EUV light, for example the optic may be in the form of a truncated paraboloid or may be configured to deliver a beam having a ring-shaped cross-section to an intermediate location, see e.g., U.S. patent application Ser. No. 11/505,177 filed on Aug. 16, 2006, entitled EUV OPTICS, the contents of which are hereby incorporated by reference.

Continuing with reference to FIG. 1, the EUV light source 20 may also include an EUV controller 60, which may also include a firing control system 65 for triggering one or more lamps and/or laser devices in the system 22 to thereby generate light pulses for delivery into the chamber 26. The EUV light source 20 may also include a droplet position detection system which may include one or more droplet imagers 70, that provide an output indicative of the position of one or more droplets, e.g., relative to the irradiation region. The imager(s) 70 provide this output to a droplet position detection feedback system 62, which can, e.g., compute a droplet position and/or trajectory, from which a droplet position error can be computed, e.g., on a droplet by droplet basis or on average. The droplet error may then be provided as an input to the controller 60, which can, for example, provide a position, direction and/or timing correction signal to the system 22 to control a source timing circuit and/or to control a beam position and shaping system, e.g., to change the location and/or focal power of the light pulses being delivered to the irradiation region in the chamber 26.

The EUV light source 20 may include one or more EUV metrology instruments for measuring various properties of the EUV light generated by the source 20. These properties may include, for example, intensity (e.g., total intensity or intensity within a particular spectral band), spectral bandwidth, polarization, beam position, pointing, etc.

As further shown in FIG. 1, the EUV light source 20 may include a droplet control system 90, operable in response to a signal, which in some implementations may include the droplet error described above, or some quantity derived therefrom the controller 60, to e.g., modify the release point of the target material from a droplet source 92 and/or modify droplet formation timing, to correct for errors in the droplets arriving at the desired irradiation region, and/or synchronize the generation of droplets with the pulsed laser system 22.

More details regarding various droplet dispenser configurations and their relative advantages may be found in U.S. patent application Ser. No. 11/827,803 filed on Jul. 13, 2007, entitled LASER PRODUCED PLASMA EUV LIGHT SOURCE HAVING A DROPLET STREAM PRODUCED USING A MODULATED DISTURBANCE WAVE; U.S. patent application Ser. No. 11/358,988 filed on Feb. 21, 2006, entitled LASER PRODUCED PLASMA EUV LIGHT SOURCE WITH PRE-PULSE; U.S. patent application Ser. No. 11/067,124 filed on Feb. 25, 2005, entitled METHOD AND APPARATUS FOR EUV PLASMA SOURCE TARGET DELIVERY; and U.S. patent application Ser. No. 11/174,443 filed on Jun. 29, 2005, entitled LPP EUV PLASMA SOURCE MATERIAL TARGET DELIVERY SYSTEM; the contents of each of which are hereby incorporated by reference.

FIG. 1 also shows that the light source 20 may include a vacuum system 100, e.g. including a vacuum pump and controller for evacuating the chamber 26, and for some implementations may include a source 102 for introducing an etchant into the chamber 26 to clean debris from optics such as the optic 30 and/or for introducing an ion slowing buffer gas such as Hydrogen, Helium or Argon. For example, the etchant may include $Cl_2$, $Br_2$, HBr, HI, HCl, $H_2$, $CF_3$, H radicals, some other halogen-containing compound, or a combination thereof. For the light source 20, the etchant may be introduced into the chamber and/or present in the chamber 26 during operation (i.e., while the light source is generating EUV light) and/or during maintenance periods.

FIG. 1 also schematically shows that the light source 20 may include a system 104 for heating the optic 30. For example, when tin is used as a target material for generating a plasma and an etchant is employed, the reflective surface of the optic may be maintained at temperature in the range of 150-400° C. to initiate reaction and/or increase the chemical reaction rate of the etchant and/or to maintain the etching rate at a certain level.

Figure 2:
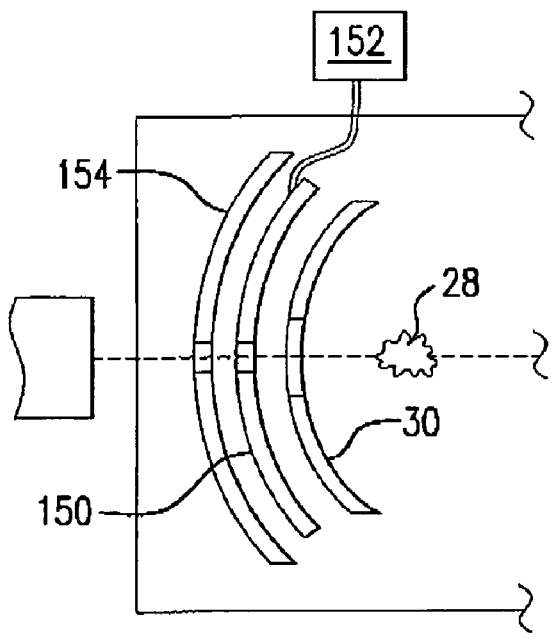
FIG. 2 shows a sectional, partially schematic view of device for heating an optic having an infrared radiator and a reflector.

In more detail, FIG. 2 shows that the light source may include an optic 30, a system generating infrared radiation having an infrared radiator 150, and a source 152 passing current through the radiator 150. Also shown, the light source may include an optional infrared reflector 154.

Figure 3:
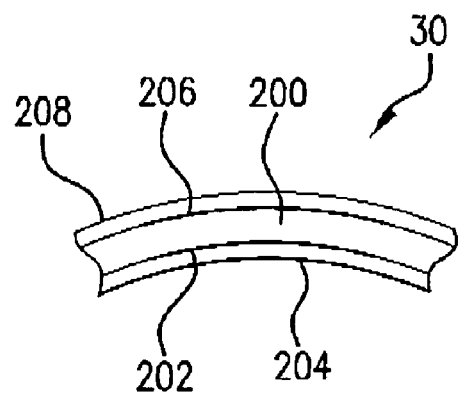
FIG. 3 shows a sectional, not to scale, view of a optic having an infrared absorbing coating.

As best seen in FIG. 3, the optic 30 may include a substrate 200 made of a substantially infrared transparent material such as Silicon or Silicon carbide and having a first side 202 coated with an EUV reflective multi-layer coating 204 (see description above) overlaying the first side 202. As shown, the optic 30 may include an opposed second side 206 having an infrared absorbing coating 208 overlaying (and in some cases directly contacting) the second side 206. For example, the coating may include an Aluminum Titanium multilayer material or one or more layers of Titanium Oxide, and/or a nitride such as Silicon Nitride, Boron Nitride, Carbon Nitride, Niobium Nitride, Zirconium Nitride, Titanium Nitride, Aluminum Nitride and Silicon Oxy-nitride. The coating may be deposited directly on the side 202 of the substrate using a deposition process such as vacuum deposition, flame-spraying, electroplating or a physical vapor deposition technique such as ion beam sputter deposition, electron beam physical vapor deposition or magnetron sputtering. Other techniques can include chemical vapor deposition. Coating thicknesses in the range of about 100 nm to 2 μm may be suitable, depending of the coating material and the spectrum and intensity of infrared radiation produced by the radiator 150. For the light source, the coating and infrared radiation spectrum/intensity may be matched to achieve efficient heating of the optic 30 (i.e., the relationship between radiation spectrum/intensity and coating heating may be measured and used to determine an optimal current to be passed through the resistive materials in the radiator.

For the device, the radiator 150 shown in FIG. 2 may include resistive material in the form of wire, filament, ribbon, foils, sheets, etc., and depending on the environment, e.g., the use of one or more etchants, the level of vacuum, etc., and the resistive material used, may be either bare or coated with a protective coating. Suitable resistive materials may include, but are not necessarily limited to molybdenum, tungsten or titanium. Suitable protective coatings for the resistive materials may include, but are not necessarily limited to silicon nitride, boron nitride and carbon. The radiator assembly may include one or more support structures e.g., hangers (which may or may not be formed of a resistive material) for holding/suspending the resistive material in a pattern/array, suitable to provide a substantially uniform infrared radiation intensity on portions or all of the optic 30.

Figure 4:
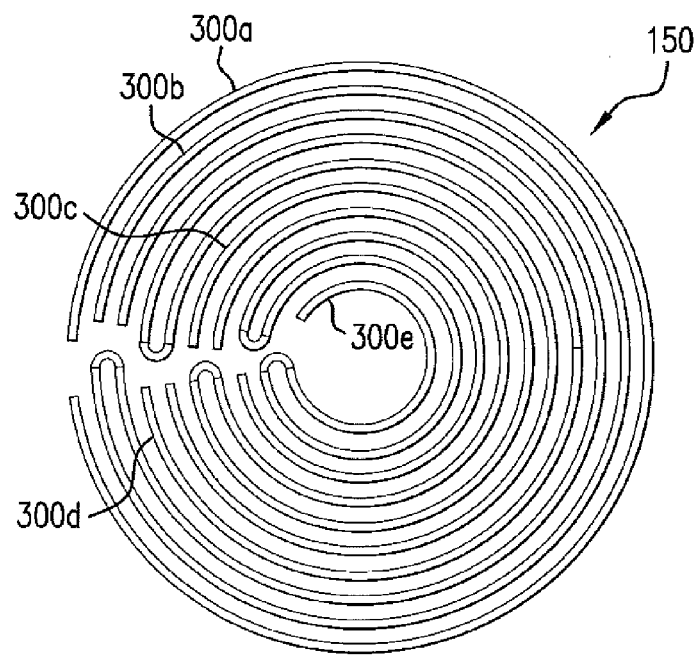
FIGS. 4 and 5 show front and perspective views, respectively, of a infrared radiator.
Figures 5, 6:
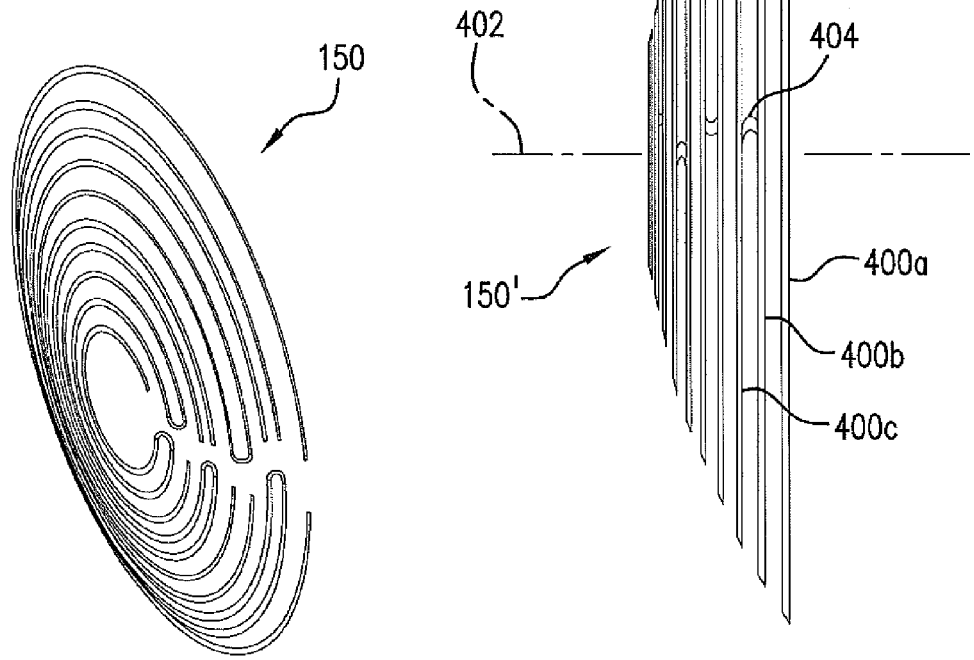
FIGS. 6 and 7 show side and front views, respectively, of another infrared radiator.

FIGS. 4 and 5 illustrate a suitable radiator 150 having five resistive elements 300a-e, e.g., wires or filaments, each arranged in a spiral pattern. Although an embodiment with five resistive elements is shown, it is to be appreciated that more than five, and as few as one resistive element may be used. For this radiator, each of the resistive elements 300a-e may be connected to a common current source or a plurality of independently operable current sources, a multi-channel current source may be employed, with each current source/channel passing current through one or more of the resistive elements. For the device, each current source may provide a continuous DC current or a signal generator may be employed to produce a more complicated waveform, e.g. AC, pulsed, square wave, etc. As shown in FIG. 5, the radiator 150 may be concave from the center to the outer edge with a concavity shaped to substantially conform to the concavity of the backside surface the optic 30 (shown in FIG. 2).

Figure 7:
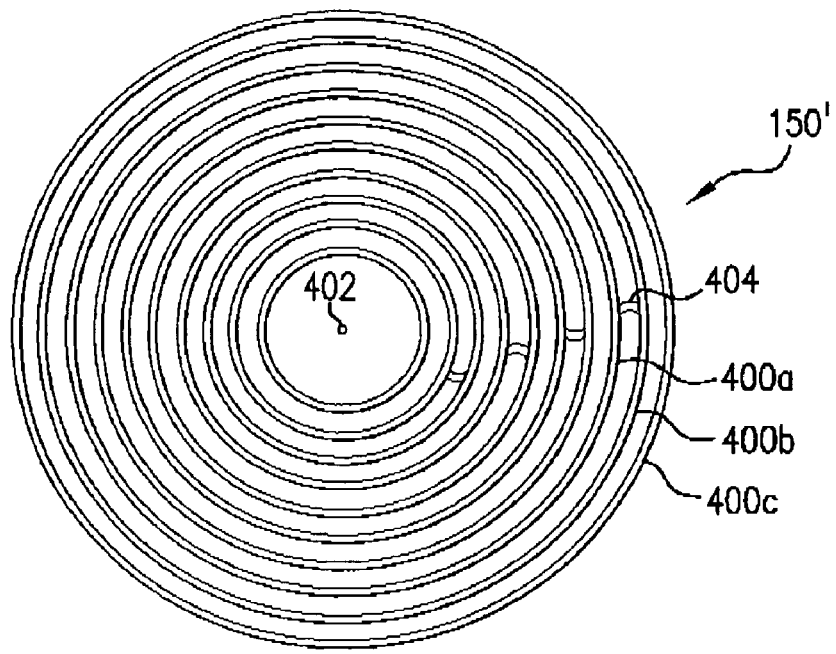

FIGS. 6 and 7 illustrate another suitable radiator 150' having a plurality of parallel, circular resistive elements (of which selective resistive elements 400a-c have been labeled). As shown, the circular resistive elements may be arranged concentrically about a common axis 402, with adjacent elements electrically connected via connectors 404. As shown, the wires may be arranged such that the radiator 150' may be concave from the center to the outer edge with a concavity shaped to substantially conform to the concavity of the backside surface the optic 30 (shown in FIG. 2).

Referring back to FIG. 2, it can be seen that an infrared reflector 154 may be positioned behind the radiator 150, (i.e., positioned to interpose the infrared radiator between the reflector and the infrared coating), to increase the amount of infrared radiation incident on the backside of the optic 30. For example, the reflector 154 may be made of an infrared reflective material, e.g., molybdenum or titanium and/or may be coated with an infrared reflective material, and may be shaped to conform with the shape/concavity of the backside surface the optic 30, as shown.

For the embodiment shown in FIG. 2, it can be seen that the radiator 150 is spaced from the backside of the optic 30 and may be in fluid communication with the irradiation region 28, which it typically maintained at pressures below atmospheric, e.g., near vacuum, to facilitate plasma production. FIG. 1 shows that a vacuum system 100, e.g., including a vacuum pump and controller for evacuating the chamber 26, and/or a source 102 for introducing an etchant and/or ion slowing buffer gas may be provided. Thus the atmosphere between the radiator 150 and the backside of the optic 30 may be near vacuum or substantially below atmospheric with etchant(s) and/or butter gases. It is to be appreciated that for this setup, heating of the optic 30 by conduction or convection may be problematic. On the other hand, radiative heating using an infrared coating on the otherwise infrared transparent substrate may provide an effective heating solution in the vacuum environment.

Figures 8, 9:
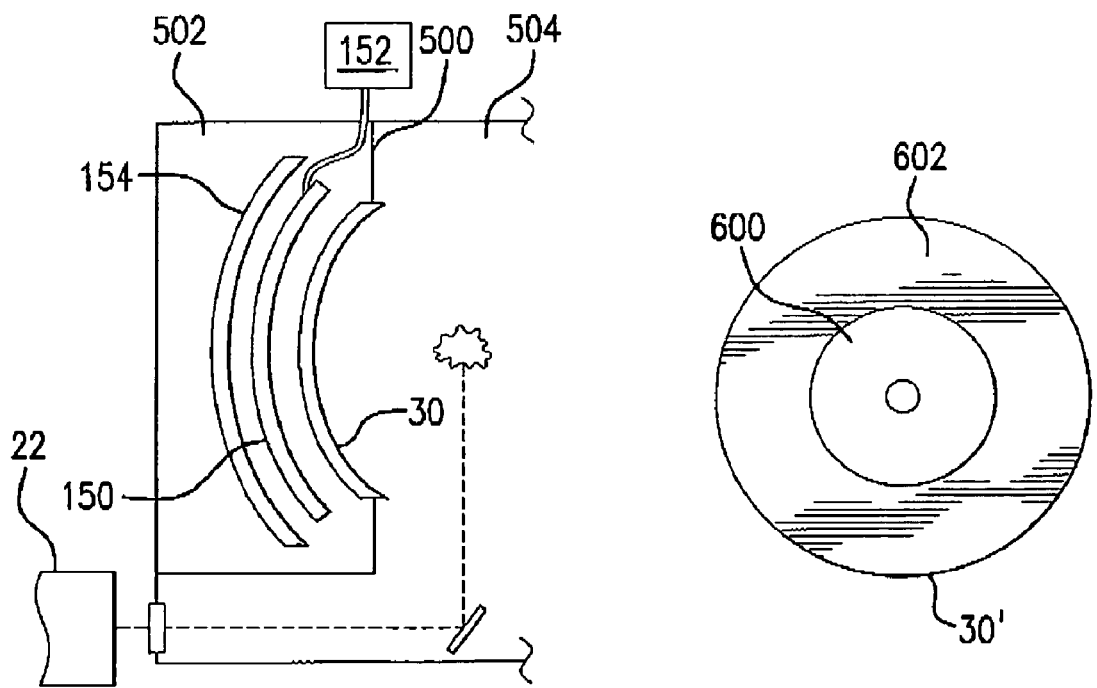
FIG. 8 shows a sectional, partially schematic view of a portion of an EUV light source having a partition to separate the chamber in two compartments.
FIG. 9 shows a view of an optic backside having multiple heating zones for heating portions of the optic backside to different temperatures.

FIG. 8 shows an alternative arrangement in which a partition 500 may be employed to separate the chamber 26 into sealed or semi-sealed compartments 502, 504. With this arrangement, compartment 504 may be maintained at pressures below atmospheric, e.g., near vacuum, to facilitate plasma production and/or may include an etchant, while a more benign atmosphere may be maintained in compartment 502 to decrease material instability and/or to increase conductive and/or convective heat transfer.

FIG. 9 shows the backside of another embodiment of an optic 30' in which the infrared absorbing coating may overlay the second side of the substrate nonuniformly. In particular, in the coating may be configured to heat a first zone 600 of the substrate backside to a first temperature, $T_1$, and heat a second zone 602 of the substrate backside to a second temperature, $T_2$, with $T_1 \neq T_2$, when irradiated by a substantially uniform infrared radiation intensity distribution. Although two zones are shown, it is to be appreciated that more than two zones may be employed.

For many optics, including a prolate spheroid shaped optic, some portions of the reflective surface of the optic may be located further from the plasma than other portions, and as a consequence, may receive differing heat inputs from the plasma (e.g., ions must travel further through a buffer gas and are therefore slowed more). By heating backside zones differently, a uniform temperature on the surface of the optic may be obtained. Alternatively, it may be desirable to have a non-uniform temperature on the reflective surface. For example, the etch rate of some etchants is known to vary with temperature and plasma-debris deposition may vary at locations along the optic surface, thus, temperature control may be used to prevent over-etching which can damage the optic.

For the infrared absorbing backside coating shown in FIG. 9, the amount of heat generated may be selectively varied from one zone to another in several ways. For example, the coating thickness and/or the coating surface coverage (e.g., the percentage of surface within a zone covered by the coating) and/or coating absorptance (e.g., different coating materials may be used), may be varied to establish differential heating. Alternatively, or in addition to the variations described above, multiple infrared radiators may be employed, each having a different patterns and/or each being connected to an independent current source.

While the particular embodiment(s) described and illustrated in this Patent Application in the detail required to satisfy 35 U.S.C. §112 are fully capable of attaining one or more of the above-described purposes for, problems to be solved by, or any other reasons for or objects of the embodiment(s) above-described, it is to be understood by those skilled in the art, that the above-described embodiment(s) are merely exemplary, illustrative and representative of the subject matter which is broadly contemplated by the present application. Reference to an element in the following Claims in the singular, is not intended to mean, nor shall it mean in interpreting such Claim element "one and only one" unless explicitly so stated, but rather "one or more". All structural and functional equivalents to any of the elements of the above-described embodiment(s) that are known or later come to be known to those of ordinary skill in the art are expressly incorporated herein by reference and are intended to be encompassed by the present Claims. Any term used in the Specification and/or in the Claims and expressly given a meaning in the Specification and/or Claims in the present Application shall have that meaning, regardless of any dictionary or other commonly used meaning for such a term. It is not intended or necessary for a device or method discussed in the Specification as an embodiment to address or solve each and every problem discussed in this Application, for it to be encompassed by the present Claims. No element, component, or method step in the present disclosure is intended to be dedicated to the public regardless of whether the element, component, or method step is explicitly recited in the Claims. No claim element in the appended Claims is to be construed under the provisions of 35 U.S.C. §112, sixth paragraph, unless the element is expressly recited using the phrase "means for" or, in the case of a method claim, the element is recited as a "step" instead of an "act".

We claim:

1. A device, comprising:
    a substrate made of a material comprising silicon, said substrate having a first side and an opposed second side;
    an EUV reflective multi-layer coating overlaying at least a portion of said first side;
    an infrared absorbing coating overlaying at least a portion of said second side, the infrared absorbing coating comprises a material that is different from the material of the substrate; and
    a system generating infrared radiation to heat said absorbing coating and said substrate.

2. A device as recited in claim 1 wherein said system comprises an infrared radiator and a source passing current through said radiator.

3. A device as recited in claim 2 wherein said infrared radiator is spaced from said infrared absorbing coating.

4. A device as recited in claim 2 further comprising a chamber and wherein said infrared radiator and said substrate are disposed in said chamber.

5. A device as recited in claim 1 further comprising a chamber, said substrate disposed in said chamber, and a vacuum system evacuating said chamber.

6. A device as recited in claim 1 further comprising a chamber, said substrate disposed in said chamber, and a source for introducing an etchant into said chamber.

7. A device as recited in claim 6 wherein said etchant is selected from the group of etchants consisting of $Cl_2$, $Br_2$, HBr, HI, HCl, $H_2$, $CF_3$, H radicals, and combinations thereof.

8. A device as recited in claim 2 wherein said radiator is formed as a ribbon.

9. A device as recited in claim 2 further comprising an infrared reflector, said reflector positioned to interpose said infrared radiator between said reflector and said infrared coating.

10. A device as recited in claim 9 wherein said reflector has a surface shaped to substantially conform with the shape of said substrate second side.

11. A device as recited in claim 1 wherein said infrared radiator comprises a plurality of resistive elements and a plurality of sources, each source passing current through at least one resistive element.

12. A device as recited in claim 1 wherein said coating is selected from the group of materials consisting of Silicon Nitride, Boron Nitride, Carbon Nitride, Niobium Nitride, Zirconium Nitride, Titanium Nitride, Aluminum Nitride, Silicon Oxy-nitride, Titanium Oxide and an Aluminum Titanium multilayer material.

13. A device as recited in claim 1 wherein the coating overlays said second side of said substrate nonuniformly and is configured to heat a first zone of said substrate to a first temperature, $T_1$, and heat a second zone of said substrate to a second temperature, $T_2$, with $T_1 \neq T_2$.

14. A device, comprising:
    a substrate made of an infrared transparent material;
    an EUV reflective multi-layer coating overlaying at least a portion of said substrate;
    an infrared absorbing coating overlaying at least a portion of said substrate, the infrared absorbing coating comprises a material that is different from the infrared transparent material of the substrate; and
    a conductor radiating infrared radiation, said conductor spaced from said infrared absorbing coating to heat said absorbing coating and said substrate.

15. A device as recited in claim 14 wherein said substrate is selected from the group of materials consisting of silicon and silicon carbide.

16. A device as recited in claim 14 wherein said coating is selected from the group of materials consisting of Silicon Nitride, Boron Nitride, Carbon Nitride, Niobium Nitride, Zirconium Nitride, Titanium Nitride, Aluminum Nitride, Silicon Oxy-nitride, Titanium Oxide and an Aluminum Titanium multilayer material.

17. A device as recited in claim 14 further comprising a chamber, said substrate disposed in said chamber, and a source for introducing an etchant into said chamber.

18. An EUV light source comprising:
    a chamber;
    a system generating an EUV light emitting plasma in said chamber;
    an optic positioned in said chamber, said optic having a substrate and a first surface portion exposed to EUV light;
    a system generating radiation; and
    a material coupled to a second surface portion of said optic to absorb at least a portion of said radiation, the material coupled to the second surface portion is different from the material of the substrate, and generate heat from said absorption to heat said optic to a temperature exceeding 100 degrees centigrade.

19. A device as recited in claim 18 wherein said substrate is selected from the group of materials consisting of silicon and silicon carbide and said material is selected from the group of materials consisting of Silicon Nitride, Boron Nitride, Carbon Nitride, Niobium Nitride, Zirconium Nitride, Titanium Nitride, Aluminum Nitride, Silicon Oxy-nitride, Titanium Oxide and an Aluminum Titanium multilayer material.

20. A device as recited in claim 18 further comprising a chamber, said substrate disposed in said chamber, and a source for introducing an etchant into said chamber.

* * * * *